United States Patent
Kamenický et al.

(10) Patent No.: US 7,724,066 B2
(45) Date of Patent: May 25, 2010

(54) SWITCHING CIRCUIT USING CLOSED CONTROL LOOP TO PRECHARGE GATE OF SWITCHING TRANSISTOR AND STABLE OPEN LOOP TO SWITCH THE SWITCHING TRANSISTOR

(75) Inventors: Petr Kamenický, Brno (CZ); Luděk Pantůček, Brno-Mesto (CZ)

(73) Assignee: ON Semiconductor, Phoenix, AZ (US)

( * ) Notice: Subject to any disclaimer, the term of this patent is extended or adjusted under 35 U.S.C. 154(b) by 0 days.

(21) Appl. No.: 11/157,402

(22) Filed: Jun. 20, 2005

(65) Prior Publication Data

US 2006/0285260 A1    Dec. 21, 2006

(51) Int. Cl.
H03K 17/687    (2006.01)
(52) U.S. Cl. ............... 327/427; 327/434; 327/157
(58) Field of Classification Search .......... 327/434, 327/427, 157
See application file for complete search history.

(56) References Cited

U.S. PATENT DOCUMENTS

| | | | |
|---|---|---|---|
| 6,100,742 A | | 8/2000 | Erckert .......... 327/374 |
| 2006/0006922 A1* | | 1/2006 | Sander .......... 327/434 |

* cited by examiner

Primary Examiner—Lincoln Donovan
Assistant Examiner—Khareem E Almo
(74) Attorney, Agent, or Firm—Workman Nydegger

(57) ABSTRACT

A switching circuit that transitions using a switch transistor. During the initial stages of a high-low transition, a control loop provides supplemental pre-charge to the gate of the switch transistor to reduce high-low switching delays. Once the current flowing through the switch transistor rises to a level causing the output voltage to change at specified speed threshold, a loop opening mechanism opens the loop. Further opening of the switch transistor in the high-low transition is taken care of by a relatively constant current source. At that point, no or negligible feedback current is used to charge the gate of the switch transistor. Low-high transitions may be performed in a similar complementary manner.

27 Claims, 6 Drawing Sheets

SWITCHING CIRCUIT USING CLOSED CONTROL LOOP TO PRECHARGE GATE OF SWITCHING TRANSISTOR AND STABLE OPEN LOOP TO SWITCH THE SWITCHING TRANSISTOR

BACKGROUND OF THE INVENTION

1. The Field of the Invention

The present invention relates generally to switching circuits. More specifically, the present invention relates to switching circuits that have controlled switching of the switching transistor for reduced Electro-Magnetic Interference (EMI), and that precharge the switching transistor for reduced switching delay.

2. Background and Relevant Art

Electronic circuitry has contributed enormously to the advancement of civilization. One of the fundamental building blocks of electronic circuitry is the switching circuit, in which a node of the circuitry is switched from one voltage to another in response to a switch control signal.

Designers of switching circuits take various constraints into account when conceiving such circuits. One of these constraints is the electromagnetic compatibility (or EMC) of the silicon chip they are designing. While operating, the chip should not radiate excessive electromagnetic energy in order not to interfere with the proper operation of other surrounding circuits. Such interference is often termed Electro-Magnetic Interference (EMI).

Electro-Magnetic energy will radiate to some extent every time a time-dependent voltage signal is present on chip. In general, the faster that voltage signal varies, the more electromagnetic energy is radiated. Since switching circuits by their very nature involve the transition of a voltage signal from one voltage to another, switching circuits also involve rapid changes in current to sustain the voltage signal transition at a particular node. These rapid changes in current cause the switching circuits to radiate EMI. EMI may be of particular concern in Pulse Width Modulation (PWM) drivers, which often generate sharp transition edges.

One conventional solution to limit EMI is to limit the slope of the transition edge when switching the switching circuit. An example of such a conventional switching circuit is illustrated in FIG. 7 as switching circuit 700. The slope of the transition edge is controlled by the current sources IQ1 and IQ2 and the capacitor C1. Accordingly, this switching circuit emits less EMI than switching circuits that do not implement slope control.

However, a main disadvantage of that switching circuit is that it has a very long delay between the command to perform a switch to the actual start of the switch. The turn-on delay is caused by the necessity for the gate to source voltage of switch transistor M1 to reach the threshold voltage of the switch transistor M1 before the switch transistor M1 starts conducting. The turn-off delay is caused by the necessity for the gate to source voltage of switch transistor M1 to drop before exiting the linear region. FIG. 8 illustrates a timing signal diagram 800 of the transition control signal VON and the switch voltage VDS across the switch transistor M1. Note the turn on delay t1 and the turn off delay t2.

Some conventional switching circuits reduce switching delay by pre-charging the gate terminal of the switch transistor prior to an off-on transition, and pre-discharging the gate terminal of the switch transistor prior to the on-off transition. However, the gate terminal should not be pre-charged to a point where the switch transistor conducts significant current. Likewise, the gate terminal should not be pre-discharged to a point where the switch transistor reduces significantly the amount of current conducted. Otherwise, the output voltage would be altered despite not being in a transition. To avoid this, a significant safety factor is built into the pre-charge and pre-discharge. This safety factor may be quite large due to the variability in transistor performance. This large safety factor often prevents much of any possible pre-charge or pre-discharge. Accordingly, such conventional circuits may still have significant switching delay.

Furthermore, this and other conventional circuits may use a closed loop to pre-charge and pre-discharge. Closed loops can be quite unstable if not designed properly. Accordingly, significant time is often expended in designing such closed loop pre-charge switching circuits.

What would thereby be advantageous are switching circuits that have slope control during transitions to reduce EMI, that perform pre-charging to reduce switching delay, and that do not need significant design and/or testing to ensure stability during operation.

BRIEF SUMMARY OF THE INVENTION

The foregoing problems with the prior state of the art are overcome by the principles of the present invention, which relate to a switching circuit that transitions using a switch transistor. Prior to a high-low transition, a control loop precharges the gate of the switch transistor to reduce high-low switching delays. Once the current flowing through the switch transistor reaches a value for which the rate of decline in output voltage (dV/dt) lowers to a specified threshold, a loop opening mechanism opens the control loop. Further opening (in the case of an n-type pull down switch transistor) or closing (in the case of a p-type pull up switch transistor) of the switch transistor in the high-low transition is taken care of by a relatively constant current source. At that point, no or negligible feedback current is used to charge the gate of the switch transistor.

Prior to the low-high transition, the control loop pre-discharges the gate of the switch transistor to reduce low-high switching delays. Once the current flowing through the switch transistor reaches a value for which the rate of increase of the output voltage dV/dt rises to a specified threshold, the loop once again opens. Further closing (in the case of an n-type pull down switch transistor) or opening (in the case of a p-type pull up switch transistor) of the switch transistor in the low-high transition is also taken care of by a constant current source, with no more than negligible current being drawn through the control loop.

The switch transistor is opened and closed at controlled speeds, resulting in reduced Electro-Magnetic Interference (EMI). Furthermore, the gate of the switch transistor is precharged prior to a high-low transition, and is pre-discharged prior to a low-high transition. This reduces switching delays that occur between the time a switch signal is provided to the time that the switching is actually initiated. Furthermore, even though a closed control loop is used to pre-charge and pre-discharge, the control loop is opened in order to perform the actual switching operation. Since the switching occurs in open loop, stability is achieved without having to rely on a well-designed stable closed loop for such switching.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to a switching circuit that transitions using a controlled voltage slope at the drain terminal of the switch transistor to thereby reduce Electro-Magnetic Interference (EMI). In addition, a closed control loop pre-charges and pre-discharges the gate voltage of the switch transistor to thereby reduce switching delay. Furthermore, unlike conventional switching circuits, the closed control loop is configured to open during the actual switching of the switch transistor. Accordingly, the switching circuit is stable during the actual switching operation, which is the operation of greatest susceptibility to instability. Therefore, the closed control loop need not be stable and thus is more easily designed and tested.

Figure 1A:
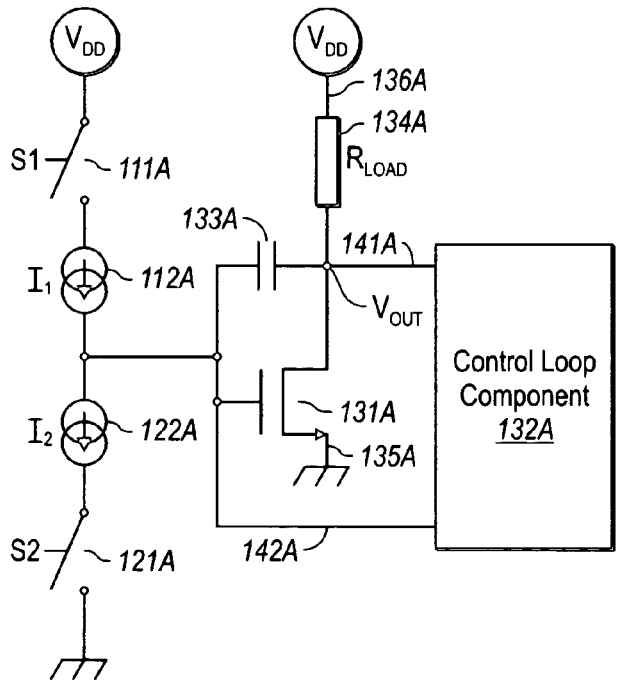
FIG. 1A is a schematic diagram of a switching circuit having an n-type field effect switch transistor in accordance with one embodiment of the present invention.

FIG. 1A is a schematic diagram of a switching circuit 100A having an n-type switch field effect transistor 131A in accordance with one embodiment of the present invention. The n-type switch field effect transistor 131A has a source terminal electrically connected to a first circuit node 135A that is configured to draw current when the n-type switch field effect transistor 131A is conducting. The drain terminal of the n-type switch field effect transistor 131A is electrically connected to the output terminal 141A of the switching circuit 100A shown as carrying voltage $V_{OUT}$. A resistor 134A having resistance $R_{LOAD}$ is shown between the output terminal 141A and a circuit node 136A that provides current. This resistance may be, but need not be, a load resistance.

When the output voltage $V_{OUT}$ is to transition from high to low, a control signal S1 transitions high, and a complementary control signal S2 transitions low. Accordingly, the switch 111A is closed and the switch 121A is opened permitting a substantially constant current $I_1$ to be provided by the current source 112A to the gate terminal of the n-type switch field effect transistor 131A. This closes the switch field effect transistor 131A to thereby draw current from the circuit node 136A, through resistor 134A, and through switch field effect transistor 131A. As the resistance through the channel region of the switch transistor 131A decreases, the output voltage $V_{OUT}$ accordingly lowers.

Conversely, when the output voltage $V_{OUT}$ is to transition from low to high, the control signal S2 transitions high, and a complementary control signal S1 transitions low. Accordingly, the switch 121A is closed and the switch 111A is opened permitting a substantially constant current $I_2$ to be drawn by the current sink 122A from the gate terminal of the n-type switch field effect transistor 131A. This increases the resistance of (and ultimately opens) the switch field effect transistor 131A to thereby increase the output voltage VOUT to a high value.

In this configuration, there is an implicit capacitance looking into the gate terminal of the n-type switch field effect transistor 131A. This capacitance means that it takes some time for the current source 112A to fully turn the switch transistor 131A on, and that it takes some time for the current source 122A to fully turn the switch transistor 131A off. In order to increase this transition time, the capacitance may be increased by capacitor 133A, which capacitively couples the drain and gate terminals of the n-type switch field effect transistor 131A. This controlled rate of transition reduces the amount of EMI emitted by the switching circuit 100A.

For example, immediately before a low to high transition, the gate voltage of switch transistor 131A is high, and the output voltage at the drain terminal of switch transistor 131A is low. As mentioned above, a low to high transition is initiated when switch 121A closes, and switch 111A opens. From this time, the current $I_2$ discharges the combination of the gate terminal capacitance of the switch transistor 131A (based on its gate to source capacitance) as well as the capacitor 133A. The split of these two discharging currents is based on capacitor ratio of these two capacitors.

When the gate voltage of switch transistor 131A reaches a voltage for which the drain current through switch transistor 131A starts to be smaller than approximately $V_{DD}/R_{LOAD}$, the output voltage Vout starts to increase. As the switch transistor 131A is in saturation at this moment, very small variations of gate voltage cause large variation in the drain current. In this state, the gate voltage of switch transistor 131A may be considered to be constant through the rest of the transition. As the change in voltage across the gate to source capacitance of switch transistor 131A is relatively small, substantially all of the discharging current $I_2$ flows through 133A. Because the gate voltage of switch transistor 131A has a relatively constant voltage, and since the current $I_2$ flowing through capacitor 133A is relatively constant, a voltage slope of $dV_{OUT}/dt=I_2/C$ (where C is the capacitance of capacitor 133A) is seen on the output voltage Vout. This is of course true if the loop composed of switch transistor 131A and capacitor 133A has sufficient gain (or in other words, if the gate voltage of switch transistor 131A varies only a little during the transition).

A control loop component 132A performs different functions depending on whether the switching circuit is transitioning to a low state (with $V_{OUT}$ being low), or transitioning to a high state (with $V_{OUT}$ being high). In particular, when the output voltage $V_{OUT}$ is in the initial stages of a high-to-low transition, the control loop component 132A partially or fully pre-charges the gate terminal of the n-type switch field effect transistor 131A through the output terminal 142A of the control loop component 132A using a closed control loop. This pre-charging supplements the relatively constant charge current $I_1$ to accelerate the pre-charging process. Once the rate of decline of the output voltage $dV_{OUT}/dt$ increases to above a certain value, the control loop component 132 opens, leaving much of the rest of the transition to occur in open loop with a relatively constant current $I_1$ driving the transition. As a secondary effect, towards the end of the transition, the rate of decline $dV_{OUT}/dt$ will once again decline below the threshold value, thereby closing the control loop component 132A. This has the effect of accelerating the end of the transition, which is not susceptible to instabilities in the control loop.

Conversely, when the output voltage $V_{OUT}$ is in the initial stages of a low-to high transition, the control loop component 132A partially or fully pre-discharges the gate terminal of the n-type switch field effect transistor 131A by drawing current through the terminal 142A of the control loop component 132A using a closed control loop. This pre-discharging supplements the relatively constant discharge current $I_2$ to accelerate the pre-charging process. Once the rate of increase of the output voltage $dV_{OUT}/dt$ increases to above a certain value, the control loop component 132 opens, leaving the rest of the transition to occur in open loop with a relatively constant current $I_2$ driving the transition. As a secondary effect, towards the end of the transition, the rate of increase $dV_{OUT}/dt$ will once again decline below the threshold value, thereby closing the control loop component 132A. Once again, this has the effect of accelerating the end of the transition, which is not susceptible to instabilities in the control loop.

This pre-charging and pre-discharging of the n-type field effect transistor 131A significantly reduces switching delay. Switching delay is the amount of time between the time that the control signal for the transition is received by the switching circuit (i.e., when the switches 111A and 121A change state) until the time the transition of the output voltage $V_{OUT}$ actually begins. During non-transitioning moments, the switching circuit is not vulnerable to any instability of the closed loop in the control loop component 132A. This is because control loop component 132A allows either only positive or negative output currents, and also because the switch transistor 131A operates in either the linear or "on" mode, or the deep subthreshold or "off" mode, and thus has no gain.

Figure 1B:
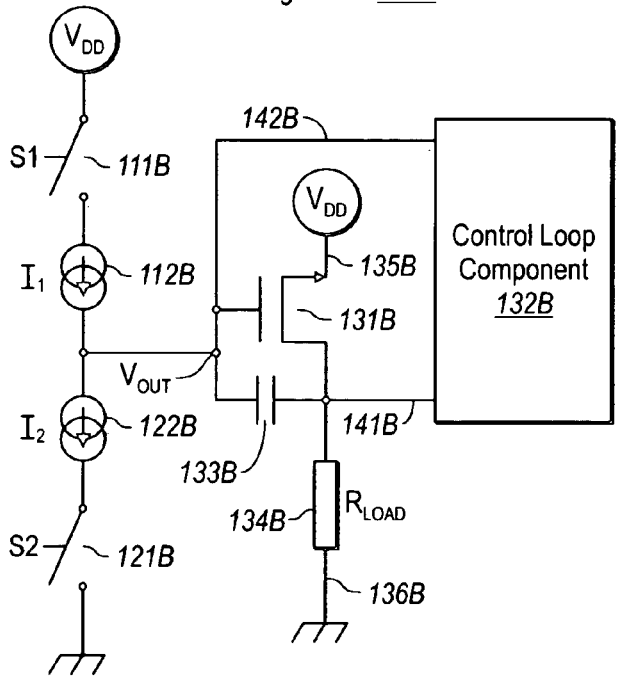
FIG. 1B is a schematic diagram of a switching circuit having a p-type field effect switch transistor in accordance with a second embodiment of the present invention.

FIG. 1B illustrates a switching circuit 100B, which is similar to the switching circuit 100A described with reference to FIG. 1A. However, in FIG. 1B, the n-type switch field effect transistor 131A is replaced by a p-type field effect transistor 131B. Circuit components 111B, 112B, 121B, 122B, 131B, 132B, 133B, 134B, 135B and 136B, 141B and 142B of FIG. 1B may be similar to circuit components 111A, 112A, 121A, 122A, 131A, 132A, 133A, 134A, 135A and 136A, 141A and 142A of FIG. 1A. In the case of FIG. 1B, however, circuit node 135B is configured to provide current, whereas circuit node 136B is configured to draw current. A high to low transition is accomplished by turning off the p-type switch field effect transistor 131B. Conversely, a low to high transition is accomplished by turning on the p-type switch field effect transistor.

Figure 2:
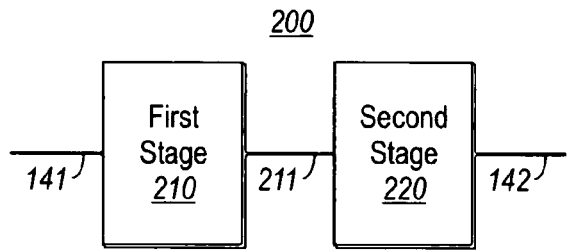
FIG. 2 illustrates the control loop component of FIGS. 1A and 1B in further detail including a first stage and a second stage.

While any configuration for the control loop component that at least partially opens during the transition will suffice, FIG. 2 schematically illustrates an embodiment 200 of the control loop component 132A of FIG. 1A, or of the control loop component 132B of FIG. 1B in further detail.

The control loop component 200 includes a first stage 210 having an input terminal 141 electrically connected to the drain terminal of the switch field effect transistor. The first stage 210 is configured to change a first stage output voltage applied to the output terminal 211 of the first stage depending on the rate of change of the first stage input voltage on the input terminal 141 of the first stage 210. The first stage output voltage is a function of the rate of change of the input voltage (i.e., $dV_{OUT}/dt$) such that if the rate of change increases above a certain rate, the first stage output voltage decreases below a first reference voltage (referred to below as $V_{REFN}$), and such that if the rate of change decreases below a certain rate, the first stage output voltage increases above a second reference voltage (referred to below as $V_{REFP}$).

The control loop component 200 also includes a second stage 220 that has an input terminal 211 electrically connected to the output terminal of the first stage 210, and an output terminal 142 that is electrically coupled to the gate terminal of the switch field effect transistor 131.

If the first stage output voltage applied to the input terminal 211 of the second stage 220 is below the second reference voltage $V_{REFP}$ and the transition of the output voltage $V_{OUT}$ is from high-to-low, a current is provided through the output terminal 142 of the second stage to the gate terminal of the switch field effect transistor 131A or 131B to thereby facilitate pre-charge. If the first stage output voltage applied to the input terminal 211 of the second stage 220 is above the first reference voltage $V_{REFN}$ and the transition of the output voltage $V_{OUT}$ is from low-to-high, a current is drawn from the gate terminal of the switch field effect transistor 131A through the output terminal 142 of the second stage 220 to thereby facilitate pre-discharge. This configuration supports the pre-charging and pre-discharging operation of the control loop component 200.

If the first stage output voltage is below the first reference voltage $V_{REFN}$ and the switching circuit is transitioning from low to high, or if the first stage output voltage is above the second reference voltage $V_{REFP}$ and the switching circuit is transitioning from high to low, the output terminal of the first stage is substantially electrically disconnected from the gate terminal of the switch field effect transistor.

Figure 3A:
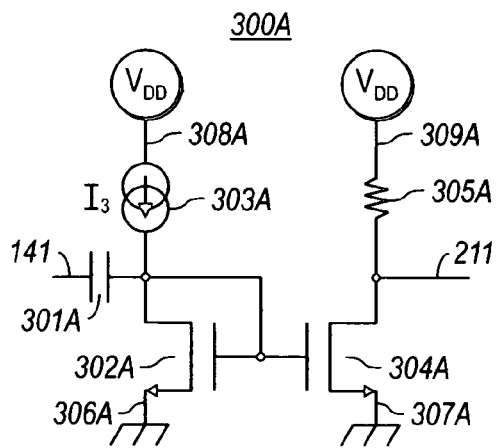
FIG. 3A illustrates a first embodiment of the first stage of FIG. 2 in which the transistors are n-type field effect transistors.
Figure 3B:
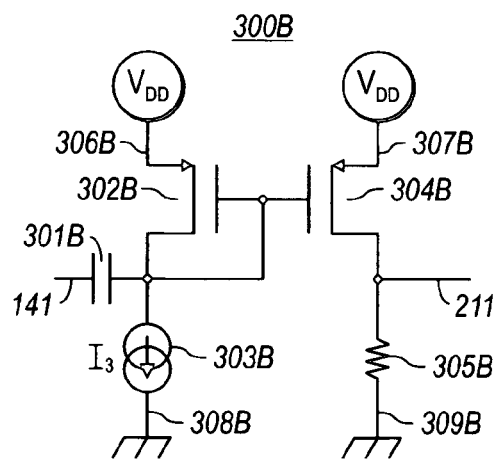
FIG. 3B illustrates a second embodiment of the first stage of FIG. 2 in which the transistors are p-type field effect transistors.
Figure 3C:
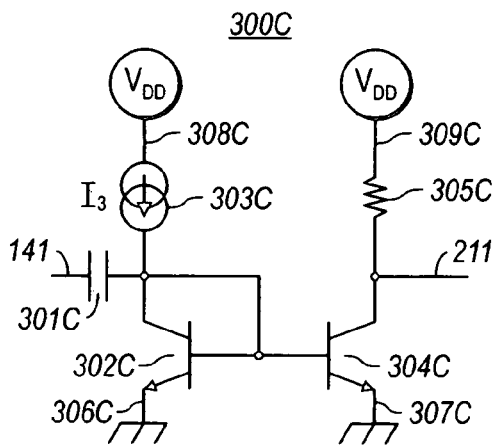
FIG. 3C illustrates a third embodiment of the first stage of FIG. 2 in which the transistors are NPN bi-polar transistors.
Figure 3D:
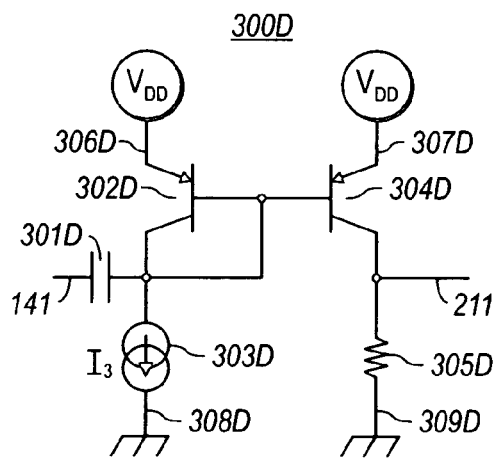
FIG. 3D illustrates a fourth embodiment of the first stage of FIG. 2 in which the transistors are PNP bi-polar transistors.

FIGS. 3A shows an example first stage circuit embodiment 300A of the first stage 210 of FIG. 2. Just as the first stage 210 of FIG. 2, the first stage circuit 300A receives a voltage signal from input terminal 141 and provides a resulting voltage signal on the output terminal 211. The first stage circuit 300A includes a capacitor 301A that capacitively couples the input terminal 141 to gate terminals of two n-type field effect transistors 302A and 304A and to the drain terminal of the n-type field effect transistor 302A. The source terminal of the n-type field effect transistor 302A is electrically connected to a circuit node 306A (such as ground) that is configured to draw current when the n-type field effect transistor 302A is conducting. A current source 303A provides a substantially constant current $I_3$ from the circuit node 308A (e.g., $V_{DD}$) to the drain terminal of the n-type field effect transistor 302A. The n-type field effect transistor 304A has a drain terminal electrically connected to the output terminal 211 of the first stage, and a source terminal electrically connected to a circuit node 307A (such as ground) that is configured to draw current when the n-type field effect transistor 304A is conducting. A resistor 305A resistively couples the output terminal 211 to another circuit node 309A that is configured to provide current through the resistor 305A. The node 309A is connected to a voltage source $V_{DD}$ to which the voltage references $V_{REFP}$ and $V_{REFN}$ (described hereinafter) are referred for reasons that will be described hereinafter. The operation of FIG. 3A will be described with respect to FIG. 5. FIGS. 3B through 3D are alternative embodiments for the first stage 210 and will be described subsequent to the descriptions of FIGS. 5 and 6.

Figure 4B:
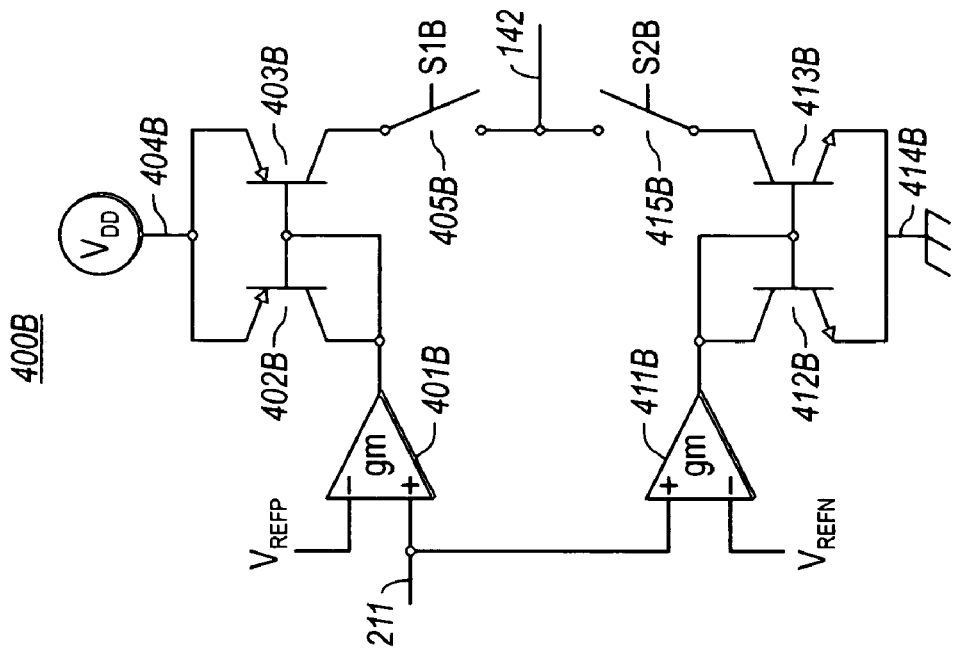
FIG. 4B illustrates a second embodiment of the second stage of FIG. 2 in which the transistors are bi-polar transistors.
Figure 4A:
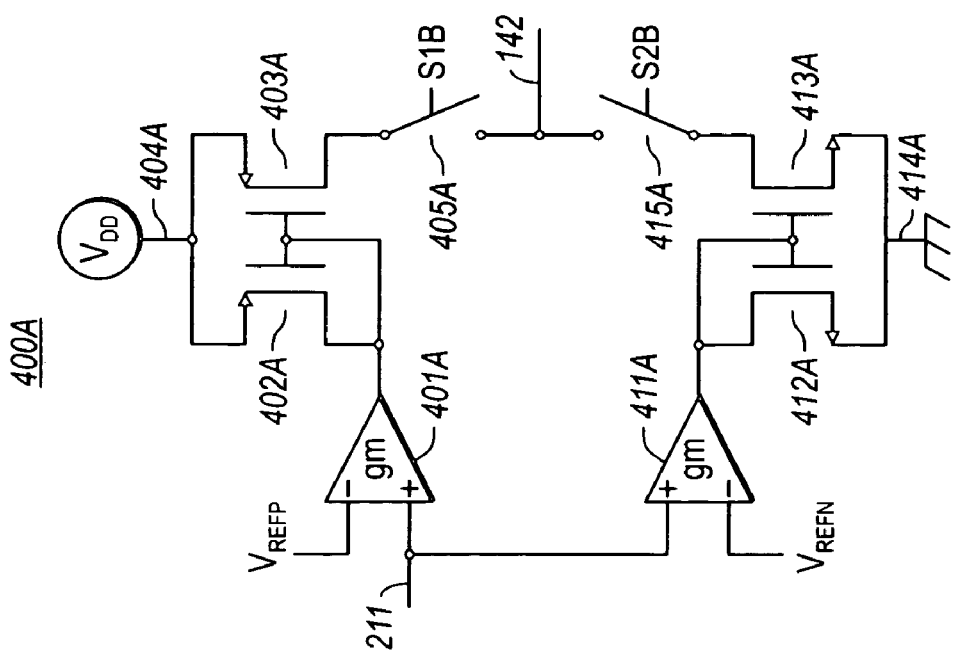
FIG. 4A illustrates a first embodiment of the second stage of FIG. 2 in which the transistors are field-effect transistors.

FIG. 4A illustrates a second stage circuit 400A that represents an embodiment of the second stage 220 of FIG. 2. Just as the second stage 220 of FIG. 2, the second stage circuit 400A receives a voltage signal from input terminal 211 and provides a resulting current on the output terminal 142.

The second stage circuit 400A includes a transconductance amplifier 401A having a negative input terminal configured to receive a reference voltage $V_{REFP}$, and a positive input terminal electrically connected to the input terminal 211. The output terminal of the transconductance amplifier 401A is electrically connected to the gate terminals of the p-type field effect transistors 402A and 403A and to the drain terminal of p-type field effect transistor 402A. The source terminals of the p-type field effect transistors 402A and 403A are electrically connected to a circuit node (e.g., $V_{DD}$) that is configured to provide current through the p-type field effect transistors 402A and 403A when conducting. The drain terminal of the p-type field effect transistor 403A is selectively connected to the output terminal 142 via a switch 405A that is controlled by a signal S1B that is controlled together with signal S1

The second stage circuit 400A also includes a transconductance amplifier 411A having a negative input terminal configured to receive a reference voltage $V_{REFN}$, and a positive input terminal electrically connected to the input terminal 211. The output terminal of the transconductance amplifier 411A is electrically connected to the gate terminals of the n-type field effect transistors 412A and 413A and to the drain terminal of n-type field effect transistor 412A. The source terminals of the n-type field effect transistors 412A and 413A are electrically connected to a circuit node (e.g., ground) that is configured to draw current through the n-type field effect transistors 412A and 413A when conducting. The drain terminal of the n-type field effect transistor 413A is selectively connected to the output terminal 142 via a switch 415A that is controlled by a signal S2B that is controlled together with signal S2. FIG. 4B illustrates an alternative embodiment for the second stage 220 and will be explained in further detail after the description of FIGS. 5 and 6.

Figure 5:
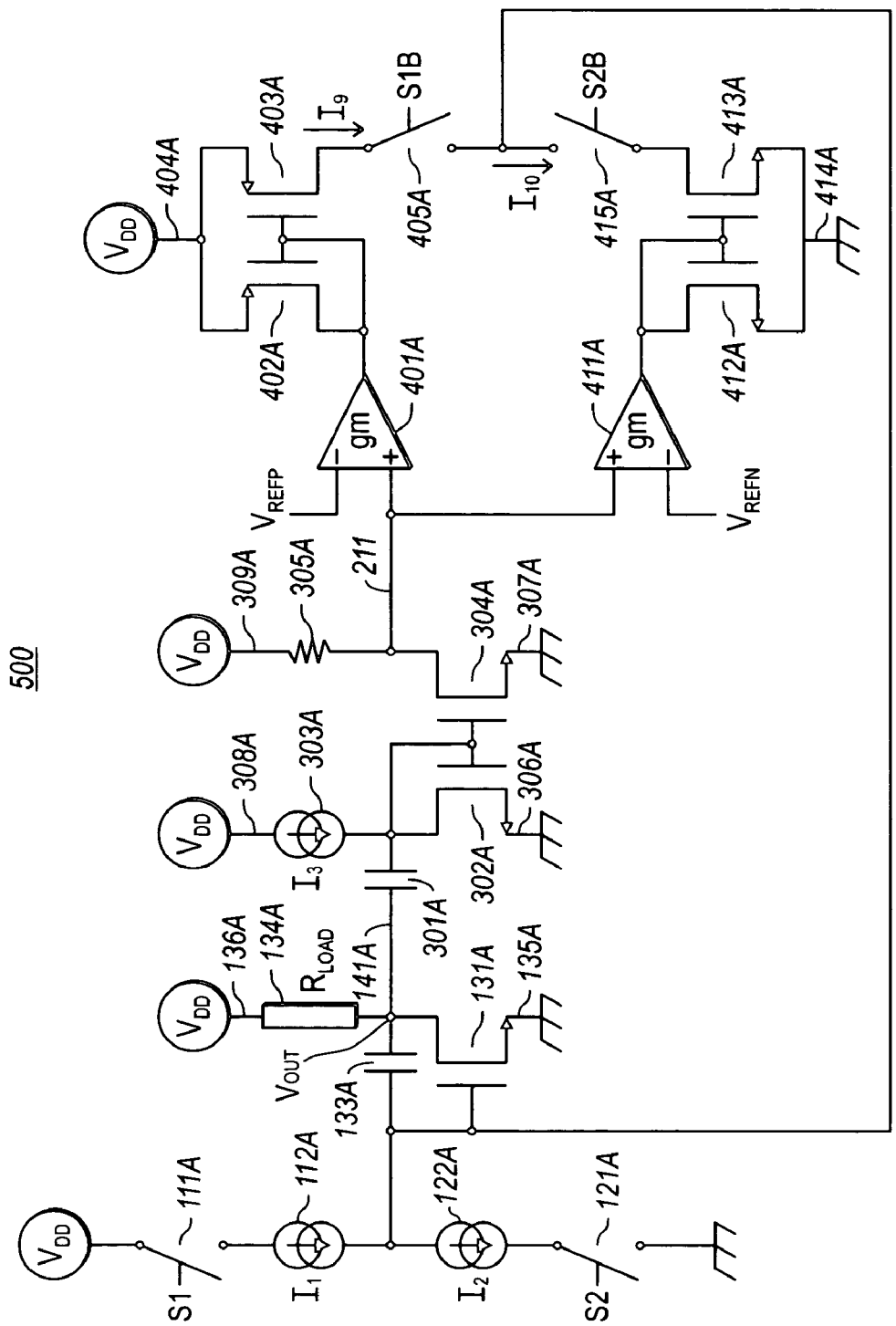
FIG. 5 illustrates a complete circuit diagram of an embodiment of the switching circuit of FIG. 1A using the first stage of FIG. 3A, and the second stage of FIG. 4A.

FIG. 5 illustrates a first particular embodiment of a switching circuit 500 in accordance with the principles of the present invention. The switching circuit 500 is the same as the switching circuit 100A of FIG. 1A, with the control loop component 132A being structured as shown in FIG. 2, and with the first stage of the control loop being as illustrated in FIG. 3A, and with the second stage of the control loop being as illustrated in FIG. 4A. The operation of the switching circuit 500 will now be described.

A driver circuit for slope limited pulse switching of the load 134A comprises a transistor switch 131A. The capacitor 133A is connected between the drain and the gate terminals of transistor 131A. The gate terminal of transistor 131A is connected to the two current sources 112A and 122A respectively activated by the switches 111A (controlled by signal $S_1$) and 121A (controlled by signal $S_2$). Signals $S_1$ and $S_2$ are complementary signals such that when switch 111A is open, the switch 121A is closed, and vice versa. The capacitor 301A is used to sense the slope $dV_{OUT}/dt$.

The current $I_S$ flowing through the sense capacitor 301A is given by the following Equation (1): $I_S=pC_S(V_{D2}-V_{OUT})$, where "$V_{D2}$" is the voltage at the drain of transistor 302A, "$C_S$" is the capacitance of sense capacitor 301A, and "p" is the Laplace variable.

In a first approximation, Equation (1) may be rewritten as Equation (2) as follows: $I_S=-pC_SV_{OUT}$. In this case, the sense current $I_S$ is approximately proportional to the slope $dV_{OUT}/dt$, where $I_S$ will be positive for falling edges ($dV_{OUT}/dt$ being negative) and negative for rising edges ($dV_{OUT}/dt$ being greater than zero). This approximation is justified by the fact that the interval of variation for $V_{OUT}$ is greater than the interval of variation of $V_{D2}$, and by the fact that $V_{D2}$ does not vary faster than $V_{OUT}$. Equation (2) is a good approximation of Equation (1) since the impedance of the drain of transistor 302A (which is approximately equal to the transconductance "gm" of the transistor 302A) is much smaller than the impedance of the output voltage (which is approximately equal to the resistance of resistor 305A).

During the initial stage of a high-to-low transition when switches 111A and 405A are initially closed, and switches 121A and 415A are initially opened, the gate terminal of the switching transistor 131A is pre-charged using a closed loop. In this state, the current $I_1$ starts to charge up the gate of the transistor 131A. As long as the gate voltage required for conduction is not reached, the switch transistor 131A remains closed in this initial stage of the high-low transition. Thus, $V_{OUT}$ does not vary and the sense current $I_S$ is zero.

The current magnitude I3, the transistors 302A and 304A, and the resistor 305A are dimensioned so that if the magnitude of the sense current $I_S$ is smaller than a given threshold, the voltage at terminal 211 will be smaller than $V_{REFP}$. This balance is important to properly open and close the control loop at the appropriate times, and so the voltage reference $V_{REFP}$ is tied to the voltage $V_{DD}$, such that variations in the supply voltage VDD will not adversely affect this balance. These same elements are also sized so that in that case, the output of transconductance amplifier 401A is sufficiently low to have current flowing through the transistor 402A. The current through transistor 402A is mirrored by transistor 403A. The mirrored current (referred to herein as $I_9$) passes through closed switch 405A, and is added to current $I_1$ at the gate terminal of switch transistor 131A.

The gate voltage of switch transistor 131A now increases at a rate $(I_1+I_9)/C$ instead of $I_1/C$, where C is the capacitance seen at the gate of transistor 131A. The current $I_9$ may be designed to be large compared to current $I_1$ so that the switch transistor 131A quickly pre-charges. As soon as switch transistor 131A starts conducting, $V_{OUT}$ will vary, and thus sense current $I_S$ will be non-zero. The current through transistor 302A is now $I_3$ minus $I_S$ instead of $I_3$. That current is mirrored by the transistor 304A. Variations of the drain current of transistor 304A are converted into voltage variations at terminal 211 using resistor 305A. As the voltage at terminal 211 increases, the output of the transconductance amplifier 401A increases. Consequently, the gate to source voltage of transistor 402A decreases and the current sourced by transistor 403A decreases. The system is designed so that the transconductance amplifier 401A rapidly saturates (i.e. its output is limited by the supply voltage of the amplifier). Transconductance amplifier 401A saturates in the moment when the voltage at node 211 becomes greater than $V_{REFP}$.

When the transconductance amplifier 401A saturates, no current flows through transistors 402A and 403A. The switch 405A is still closed, but transistor 403A is now open. Therefore, the control loop is likewise open. Once the control loop is open, the slope of $V_{OUT}$ is determined by $I_1$ alone without using the control loops. Thus there are no stability issues during the high to low transition.

A similar reasoning can be done for a low to high transition. In the initial stages of a low-to-high transition, the gate terminal of the switching transistor 131A is pre-discharged using a closed loop. In the low state, the switches 121A and 415A are closed, whereas switches 111A and 405A are open. In this state, the current $I_2$ starts to discharge the gate of the transistor 131A. As long as the transistor 131A remains closed, $V_{OUT}$ remains low and does not vary, and thus the sense current $I_S$ is zero.

As previously mentioned, the current magnitude $I_3$, the transistors 302A and 304A, and the resistor 305A are dimensioned so that if the magnitude of the sense current $I_S$ is less negative than a given threshold, the voltage at terminal 211 will be larger than $V_{REFN}$. This balance is important to properly open and close the control loop at the appropriate times, and so the voltage reference $V_{REFN}$ is also tied to the voltage $V_{DD}$, such that variations in the supply voltage VDD will not adversely affect this balance. These same elements are also sized so that in that case, the output of transconductance amplifier 411A is sufficiently high to have current flowing through the transistor 412A. The current through transistor 412A is mirrored by transistor 413A. The mirrored current (referred to herein as $I_{10}$) is drawn through closed switch 415A, and is added to the current $I_2$ drawn from the gate terminal of switch transistor 131A.

The gate voltage of switch transistor 131A now decreases at a rate $(I_2+I_{10})/C$ instead of $I_2/C$. Once again, the current $I_{10}$ may be designed to be large compared to current $I_2$ so that the switch transistor 131A quickly pre-discharges. As soon as switch transistor 131A increases resistance, $V_{OUT}$ will vary, and thus sense current $I_S$ will be non-zero. The current through transistor 302A is now $I_3$ minus $I_S$ (where $I_S$ is negative) instead of $I_3$. That current is mirrored by the transistor 304A. Variations of the drain current of transistor 304A are converted into voltage variations at terminal 211 using resistor 305A. As the voltage at terminal 211 decreases, the output of the transconductance amplifier 411A decreases. Since the transconductance amplifier has an output Iout equal to its transconductance gm times the differential input voltage Vin, the transconductance amplifier saturates. Consequently, the gate to source voltage of transistor 412A decreases and the current drained by transistor 413A decreases. The system is designed so that the transconductance amplifier 411A rapidly saturates at the point where the voltage at node 211 becomes less than $V_{REFN}$.

When the transconductance amplifier 411A saturates, no current flows through transistors 412A and 413A. The switch 415A is still closed, but transistor 413A is now open. Therefore, the control loop is likewise open. Once the control loop is open, the slope of $V_{OUT}$ is determined by $I_2$ alone without using the control loops. Thus there are no stability issues during the low to high transition.

The switching circuit 500 provides a driver (such as, but not limited to, a PWM driver) with reduced turn on and turn off delays. The circuit 500 may be used in a wide variety of operating conditions (i.e. specified $R_L$ and $dV_{OUT}/dt$) without requiring extensive stability analysis. The circuit 500 more quickly brings the switch transistor to the verge of conduction regardless of the process tolerances by operating in closed loop. Once the switch is starting to conduct, the regulation loop opens and the gate is charged in open loop without the risk that a closed loop would become unstable as in the prior art.

Having described the general principles of the present invention with respect to a specific circuit embodiment, those of ordinary skill in the art will recognize various modification and variations that be apparent from this description. For instance, FIGS. 3B through 3D represent alternative embodiments of the first stage circuit, in which the polarity of the circuit is reversed, and in which the possibility of using bipolar transistors is shown. The elements of FIGS. 3B through 3D have a similar function as described for the corresponding elements of FIG. 3A. Likewise, FIG. 4B shows that bi-polar transistors may be used in the second stage of the control loop as well.

More specifically, FIG. 3B shows a first stage circuit embodiment 300B of the first stage 210 of FIG. 2. The first stage circuit 300B includes a capacitor 301B that capacitively couples the input terminal 141 to gate terminals of two p-type field effect transistors 302B and 304B and to the drain terminal of the p-type field effect transistor 302B. The source terminal of the p-type field effect transistor 302B is electrically connected to a circuit node 306B (such as $V_{DD}$) that is configured to provide current when the p-type field effect transistor 302B is conducting. A current source 303B draws a substantially constant current $I_3$ to the circuit node 308B (e.g., ground) from the drain terminal of the p-type field effect transistor 302B. The p-type field effect transistor 304B has a drain terminal electrically connected to the output terminal 211 of the first stage, and a source terminal electrically connected to a circuit node 307B (such as $V_{DD}$) that is configured to provide current when the p-type field effect transistor 304B is conducting. A resistor 305B resistively couples the output terminal 211 to another circuit node 309B that is configured to draw current through the resistor 305B.

FIG. 3C shows yet another example first stage circuit embodiment 300C of the first stage 210 of FIG. 2. The first stage circuit 300C includes a capacitor 301C that capacitively couples the input terminal 141 to base terminals of two NPN bipolar transistors 302C and 304C and to the collector terminal of the NPN bipolar transistor 302C. The emitter terminal of the NPN bipolar transistor 302C is electrically connected to a circuit node 306C (such as ground) that is configured to draw current when the NPN bipolar transistor 302C is conducting. A current source 303C provides a substantially constant current $I_3$ from the circuit node 308C (e.g., $V_{DD}$) to the collector terminal of the NPN bipolar transistor 302C. The NPN bipolar transistor 304C has a collector terminal electrically connected to the output terminal 211 of the first stage, and an emitter terminal electrically connected to a circuit node 307C (such as ground) that is configured to draw current when the NPN bipolar transistor 304C is conducting. A resistor 305C resistively couples the output terminal 211 to another circuit node 309C that is configured to provide current through the resistor 305C.

FIG. 3D shows a final example first stage circuit embodiment 300D of the first stage 210 of FIG. 2. The first stage circuit 300D includes a capacitor 301D that capacitively couples the input terminal 141 to base terminals of two PNP bipolar transistors 302D and 304D and to the collector terminal of the PNP bipolar transistor 302D. The emitter terminal of the PNP bipolar transistor 302D is electrically connected to a circuit node 306D (such as $V_{DD}$) that is configured to provide current when the PNP bipolar transistor 302D is conducting. A current source 303D draws a substantially constant current $I_3$ to the circuit node 308D (e.g., ground) from the collector terminal of the PNP bipolar transistor 302D. The PNP bipolar transistor 304D has a collector terminal electrically connected to the output terminal 211 of the first stage, and an emitter terminal electrically connected to a circuit node 307D (such as VDD) that is configured to provide current when the PNP bipolar transistor 304D is conducting. A resistor 305D resistively couples the output terminal 211 and another circuit node 309D that is configured to draw current through the resistor 305D.

FIG. 4B illustrates an alternative second stage embodiment 400B of the second stage 220 of FIG. 2. The second stage 400B is structured similar to the second stage 400A described with respect to FIG. 4A, except that PNP bipolar transistors replace p-type bi-polar transistors, and in which NPN bipolar transistors replace n-type bi-polar transistors.

More specifically, the second stage 400B includes a first transconductance amplifier 401B having a negative input terminal configured to receive the reference voltage $V_{REFP}$, and a positive input terminal electrically connected to the input terminal 211. A PNP bi-polar transistor 402B has base and collector terminals electrically connected to the output terminal of the first transconductance amplifier 401B, and an emitter terminal electrically connected to circuit node 404B (such as $V_{DD}$) that is configured to provide current through the PNP bi-polar transistor 402B. A second PNP bi-polar transistor 403B has a base terminal electrically connected to the output terminal of the first transconductance amplifier 401B, an emitter terminal electrically connected to the circuit node 404B, and a collector terminal selectively electrically connected to the output terminal 142 of the second stage through switch 405B controlled by signal S1B.

A second transconductance amplifier 411B has a negative input terminal configured to receive the reference voltage $V_{REFN}$, and a positive input terminal electrically connected to the input terminal 211. An NPN bi-polar transistor 412B has base and collector terminals electrically connected to an output terminal of the second transconductance amplifier 411B, and an emitter terminal electrically connected to a circuit node 414B (such as ground) that is configured to drawn current through the NPN bi-polar transistor 412B. A second NPN bi-polar transistor 413B has a base terminal electrically connected to the output terminal of the second transconductance amplifier 411B, an emitter terminal electrically connected to the circuit node 414B, and a collector terminal selectively electrically connected to the output terminal 142 of the second stage through switch 415B controlled by signal S2B.

Figure 6:
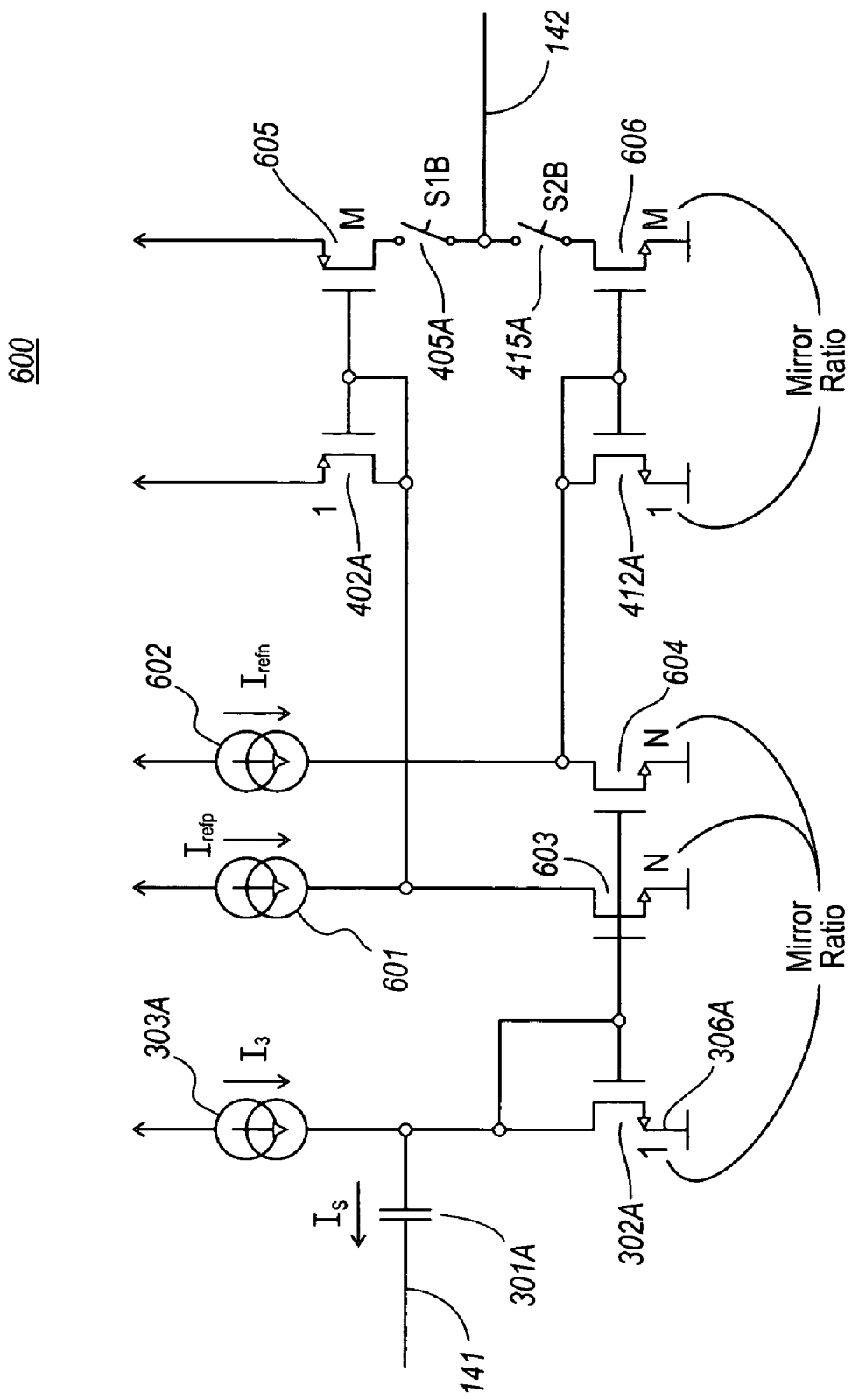
FIG. 6 illustrates an alternative embodiment of a control loop component suitable as the control loop component of FIGS. 1A and 1B.
Figure 7:
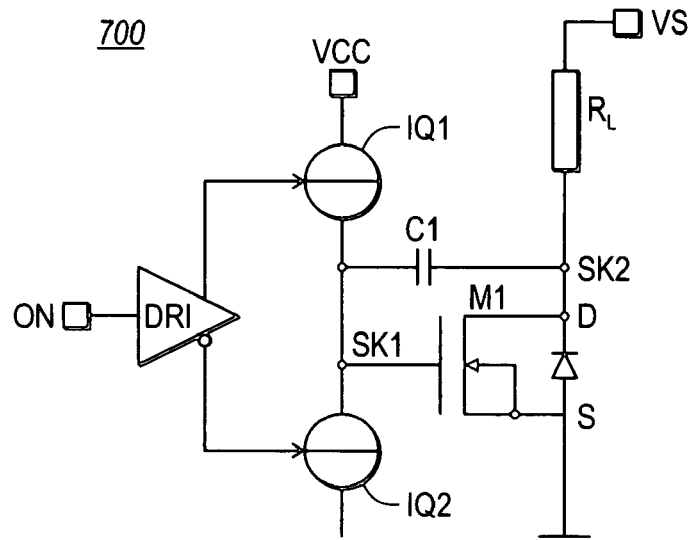
FIG. 7 is a circuit diagram of a conventional switching circuit.
Figure 8:
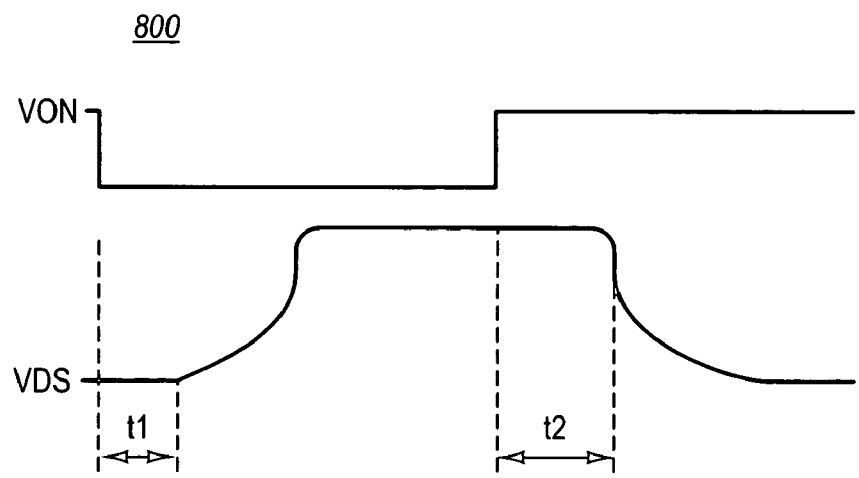
FIG. 8 is a signal timing diagram associated with the conventional switching circuit of FIG. 7.

FIG. 6 illustrates a second particular embodiment 600 of a control loop component 132A of FIG. 1A or 132B of FIG. 1B. During the high-to-low transition, when the rate of decline $dV_{OUT}/dt$ of the output voltage starts to accelerate, the current $I_S$ increases in the positive direction. This causes the current passing through transistor 302A to decrease from $I_3$ by increasing amounts. This decreasing current is passed through transistor 604 sized with ratio N with respect to the transistor 302A. More importantly for high-to-low transitions, however, the decreasing current is passed through transistor 603 sized with ratio N with respect to transistor 302A. Before the current passing through transistor 603 (equal to N times $(I_3-I_S)$) drops below the current $I_{refp}$ provided by current source 601, there is a current drawn from the gate terminals of p-type transistor 402A, causing transistor 402A to conduct. That current is mirrored by mirror ratio M (where M may be much larger than 1) to provide a supplemental pre-charge current through switch 405A, to the terminal 142 and to the gate of the switch transistor. However, once the current passing through transistor 603 drops below the current $I_{refp}$ provided by current source 601 (due to a more rapid decline in the output voltage), there is a current provided to the gate terminal of p-type transistor 402A, causing transistor 402A to turn off. That opens the control loop for much of the remainder of the transition, until the rate of decline $dV_{OUT}/dt$ once again drops below the threshold.

During the low-to-high transition, when the rate of increase $dV_{OUT}/dt$ of the output voltage starts to accelerate, the current $I_S$ increases in the negative direction. This causes the current passing through transistor 302A to increase from $I_3$ by increasing amounts. This increasing current is passed through transistor 604 sized with ratio N with respect to the transistor 302A. Before the current passing through transistor 604 (equal to N times $(I_3-I_S)$ (where $I_S$ is negative)) increases above the current $I_{refn}$ provided by current source 602, there is a current provided from the gate terminals of n-type transistor 412A, causing transistor 412A to conduct. That current is mirrored by mirror ratio M (where M may be much larger than 1) to provide a supplemental pre-discharge current through switch 415A, to the terminal 142 and to the gate of the switch transistor. However, once the current passing through transistor 604 increase to be above the current $I_{refn}$ provided by current source 602 (due to a more rapid increase in the output voltage), there is a current drawn from the gate terminal of n-type transistor 412A, causing transistor 412A to turn off. That opens the control loop for much of the remainder of the transition, until the rate of increase $dV_{OUT}/dt$ once again drops below the threshold.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A switching circuit comprising:
    a switch field effect transistor having a gate terminal, a source terminal electrically connected to a first circuit node that includes a means for providing or drawing current when the switch field effect transistor is conducting, and a drain terminal that is electrically connected to an output terminal of the switching circuit;
    a current source that includes a means for providing current to the gate terminal of the switch field effect transistor in response to a transition high to low control signal, wherein the current source also includes a means for providing a lesser or no current to the gate terminal of the switch field effect transistor in response to a transition low to high control signal;
    a current sink that includes a means for drawing from the gate terminal of the switch field effect transistor in response to a transition low to high control signal, wherein the current sink also includes a means for drawing a lesser or no current from the gate terminal of the switch field effect transistor in response to a transition high to low control signal; and
    a control loop component that comprises the following:
        means for at least partially pre-charging the gate terminal of the switch field effect transistor through a closed control loop during at least an initial time when the switching circuit is transitioning in a first direction when a resistance is present between the output terminal of the switching circuit and a second circuit node that provides current if the first circuit node draws current and that draws current if the first circuit node provides current;

means for at least partially pre-discharging the gate terminal of the switch field effect transistor through the closed control loop during at least an initial time when the switching circuit is transitioning in a second direction opposite the first direction when a resistance is present between the output terminal of the switching circuit and a second circuit node that provides current if the first circuit node draws current and that draws current if the first circuit node provides current; and means for temporarily opening the closed control loop during at least a portion of a time when the switching circuit is transitioning in either the first direction or the second direction when a resistance is present between the output terminal of the switching circuit and a second circuit node that provides current if the first circuit node draws current and that draws current if the first circuit node provides current.

2. A switching circuit in accordance with claim 1, further comprising:
a capacitor capacitively coupling the drain and gate terminals of the switch field effect transistor.

3. A switching circuit in accordance with claim 1, wherein the switch field effect transistor is an n-type field effect transistor, and the first circuit node is configured to draw current when the n-type field effect transistor is conducting.

4. A switching circuit in accordance with claim 1, wherein the switch field effect transistor is a p-type field effect transistor, and the first circuit node is configured to provide current when the p-type field effect transistor is conducting.

5. A switching circuit in accordance with claim 1, wherein the current source is configured to provide a substantially constant amount of current to the gate terminal of the switch field effect transistor in response to the transition high to low control signal.

6. A switching circuit in accordance with claim 1, wherein the current sink is configured to draw a substantially constant amount of current from the gate terminal of the switch field effect transistor in response to the transition low to high control signal.

7. A switching circuit in accordance with claim 1, wherein the control loop component comprises the following:
a first stage having an input terminal electrically connected to the drain terminal of the switch field effect transistor, and an output terminal,
wherein the first stage is configured to change a first stage output voltage applied to the output terminal of the first stage depending on a first stage input voltage on the input terminal of the first stage, and
wherein the first stage output voltage is a function of the rate of change of the input voltage such that if the rate of change increases above a certain rate, the first stage output voltage decreased to below a first reference voltage, and such that if the rate of change decreases below a certain rate, the first stage output voltage increases above a second reference voltage; and
a second stage having an input terminal electrically connected to the output terminal of the first stage and an output terminal that is electrically coupled to the gate terminal of the switch field effect transistor, wherein the second stage is configured to perform the following:
if the first stage output voltage applied to the input terminal of the second stage is below the second reference voltage, a current is provided through the output terminal of the second stage to the gate terminal of the switch field effect transistor;
if the first stage output voltage applied to the input terminal of the second stage is above the first reference voltage, a current is drawn from the gate terminal of the switch field effect transistor through the output terminal of the second stage; and
if the first stage output voltage is below the first reference voltage and the switching circuit is transitioning from low to high, or if the first stage output voltage is above the second reference voltage and the switching circuit is transitioning from high to low, the output terminal of the first stage is substantially electrically disconnected from the gate terminal of the switch field effect transistor.

8. A switching circuit comprising:
a switch field effect transistor having a gate terminal, a source terminal electrically connected to a first circuit node that is configured to provide or draw current when the switch field effect transistor is conducting, and a drain terminal that is electrically connected to an output terminal of the switching circuit;
a current source configured to provide current to the gate terminal of the switch field effect transistor in response to a transition high to low control signal, wherein the current source is configured to provide a lesser or no current to the gate terminal of the switch field effect transistor in response to a transition low to high control signal;
a current sink configured to draw current from the gate terminal of the switch field effect transistor in response to a transition low to high control signal, wherein the current sink is configured to draw a lesser or no current from the gate terminal of the switch field effect transistor in response to a transition high to low control signal; and
a control loop component configured to do the following when a resistance is present between the output terminal of the switching circuit and a second circuit node that provides current if the first circuit node draws current and that draws current if the first circuit node provides current:
an act of at least partially pre-charging the gate terminal of the switch field effect transistor through a closed control loop during at least an initial time when the switching circuit is transitioning in a first direction;
an act of at least partially pre-discharging the gate terminal of the switch field effect transistor through the closed control loop during at least an initial time when the switching circuit is transitioning in a second direction opposite the first direction; and
an act of temporarily opening the closed control loop during at least a portion of a time when the switching circuit is transitioning in either the first direction or the second direction,
wherein the control loop component comprises the following:
a first stage having an input terminal electrically connected to the drain terminal of the switch field effect transistor, and an output terminal,
wherein the first stage is configured to change a first stage output voltage applied to the output terminal of the first stage depending on a first stage input voltage on the input terminal of the first stage, and
wherein the first stage output voltage is a function of the rate of change of the input voltage such that if the rate of change increases above a certain rate, the first stage output voltage decreased to below a first reference voltage, and such that if the rate of change decreases below a certain rate, the first stage output voltage increases above a second reference voltage; and a second stage having an input terminal electrically connected to the output terminal of the first stage and an output terminal that is electrically coupled to the gate terminal of the switch field effect transistor, wherein the second stage is configured to perform the following:

if the first stage output voltage applied to the input terminal of the second stage is below the second reference voltage, a current is provided through the output terminal of the second stage to the gate terminal of the switch field effect transistor;

if the first stage output voltage applied to the input terminal of the second stage is above the first reference voltage, a current is drawn from the gate terminal of the switch field effect transistor through the output terminal of the second stage; and if the first stage output voltage is below the first reference voltage and the switching circuit is transitioning from low to high, or if the first stage output voltage is above the second reference voltage and the switching circuit is transitioning from high to low, the output terminal of the first stage is substantially electrically disconnected from the gate terminal of the switch field effect transistor, the first stage comprising:

a capacitor capacitively coupling the drain terminal of the switch field effect transistor to a second terminal of the capacitor;

a first n-type field effect transistor having gate and drain terminals electrically connected to the second terminal of the capacitor, and a source terminal electrically connected to a third circuit node that is configured to draw current when the first n-type field effect transistor is conducting;

a second current source configured to provide a substantially constant current to the second terminal of the capacitor;

a second n-type field effect transistor having a gate terminal electrically connected to the second terminal of the capacitor, a drain terminal electrically connected to the output terminal of the first stage, and a source terminal electrically connected to a fourth circuit node that is configured to draw current when the second n-type field effect transistor is conducting; and a resistor resistively coupling the output terminal of the first stage and a fifth circuit node that is configured to provide current through the resistor.

9. A switching circuit in accordance with claim 8, the second stage comprising:

a first transconductance amplifier having a negative input terminal configured to receive the first reference voltage, and a positive input terminal electrically connected to the output terminal of the first stage;

a first p-type field effect transistor having gate and drain terminals electrically connected to an output terminal of the first transconductance amplifier, and a source terminal electrically connected to a sixth circuit node that is configured to provide current through the first p-type field effect transistor when conducting;

a second p-type field effect transistor having a gate terminal electrically connected to the output terminal of the first transconductance amplifier, a source terminal electrically connected to the sixth circuit node, and a drain terminal selectively electrically connected to the output terminal of the second stage in response to the transition high to low control signal;

a second transconductance amplifier having a negative input terminal configured to receive the second reference voltage, and a positive input terminal electrically connected to the output terminal of the first stage;

a third n-type field effect transistor having gate and drain terminals electrically connected to an output terminal of the second transconductance amplifier, and a source terminal electrically connected to a seventh circuit node that is configured to drawn current through the third n-type field effect transistor when conducting; and a fourth n-type field effect transistor having a gate terminal electrically connected to the output terminal of the second transconductance amplifier, a source terminal electrically connected to the seventh circuit node, and a drain terminal selectively electrically connected to the output terminal of the second stage in response to the transition low to high control signal.

10. A switching circuit in accordance with claim 8, the second stage comprising:

a first transconductance amplifier having a negative input terminal configured to receive the first reference voltage, and a positive input terminal electrically connected to the output terminal of the first stage;

a first PNP bi-polar transistor having base and collector terminals electrically connected to an output terminal of the first transconductance amplifier, and an emitter terminal electrically connected to a sixth circuit node that is configured to provide current through the first PNP bi-polar transistor;

a second PNP bi-polar transistor having a base terminal electrically connected to the output terminal of the first transconductance amplifier, an emitter terminal electrically connected to the sixth circuit node, and a collector terminal selectively electrically connected to the output terminal of the second stage in response to the transition high to low control signal;

a second transconductance amplifier having a negative input terminal configured to receive the second reference voltage, and a positive input terminal electrically connected to the output terminal of the first stage;

a first NPN bi-polar transistor having base and collector terminals electrically connected to an output terminal of the second transconductance amplifier, and an emitter terminal electrically connected to a seventh circuit node that is configured to drawn current through the first NPN bi-polar transistor; and a second NPN bi-polar transistor having a base terminal electrically connected to the output terminal of the second transconductance amplifier, an emitter terminal electrically connected to the seventh circuit node, and a collector terminal selectively electrically connected to the output terminal of the second stage in response to the transition low to high control signal.

11. A switching circuit comprising:

a switch field effect transistor having a gate terminal, a source terminal electrically connected to a first circuit node that is configured to provide or draw current when the switch field effect transistor is conducting, and a drain terminal that is electrically connected to an output terminal of the switching circuit;

a current source configured to provide current to the gate terminal of the switch field effect transistor in response to a transition high to low control signal, wherein the current source is configured to provide a lesser or no current to the gate terminal of the switch field effect transistor in response to a transition low to high control signal;
a current sink configured to draw current from the gate terminal of the switch field effect transistor in response to a transition low to high control signal, wherein the current sink is configured to draw a lesser or no current from the gate terminal of the switch field effect transistor in response to a transition high to low control signal; and
a control loop component configured to do the following when a resistance is present between the output terminal of the switching circuit and a second circuit node that provides current if the first circuit node draws current and that draws current if the first circuit node provides current:
an act of at least partially pre-charging the gate terminal of the switch field effect transistor through a closed control loop during at least an initial time when the switching circuit is transitioning in a first direction;
an act of at least partially pre-discharging the gate terminal of the switch field effect transistor through the closed control loop during at least an initial time when the switching circuit is transitioning in a second direction opposite the first direction; and
an act of temporarily opening the closed control loop during at least a portion of a time when the switching circuit is transitioning in either the first direction or the second direction,
wherein the control loop component comprises the following:
a first stage having an input terminal electrically connected to the drain terminal of the switch field effect transistor, and an output terminal,
wherein the first stage is configured to change a first stage output voltage applied to the output terminal of the first stage depending on a first stage input voltage on the input terminal of the first stage, and
wherein the first stage output voltage is a function of the rate of change of the input voltage such that if the rate of change increases above a certain rate, the first stage output voltage decreased to below a first reference voltage, and such that if the rate of change decreases below a certain rate, the first stage output voltage increases above a second reference voltage; and
a second stage having an input terminal electrically connected to the output terminal of the first stage and an output terminal that is electrically coupled to the gate terminal of the switch field effect transistor, wherein the second stage is configured to perform the following:
if the first stage output voltage applied to the input terminal of the second stage is below the second reference voltage, a current is provided through the output terminal of the second stage to the gate terminal of the switch field effect transistor;
if the first stage output voltage applied to the input terminal of the second stage is above the first reference voltage, a current is drawn from the gate terminal of the switch field effect transistor through the output terminal of the second stage; and
if the first stage output voltage is below the first reference voltage and the switching circuit is transitioning from low to high, or if the first stage output voltage is above the second reference voltage and the switching circuit is transitioning from high to low, the output terminal of the first stage is substantially electrically disconnected from the gate terminal of the switch field effect transistor, the first stage comprising:
a capacitor capacitively coupling the drain terminal of the switch field effect transistor to a second terminal of the capacitor;
a first p-type field effect transistor having gate and drain terminals electrically connected to the second terminal of the capacitor, and a source terminal electrically connected to a third circuit node that is configured to provide current when the first p-type field effect transistor is conducting;
a second current sink configured to draw a substantially constant current from the second terminal of the capacitor;
a second p-type field effect transistor having a gate terminal electrically connected to the second terminal of the capacitor, a drain terminal electrically connected to the output terminal of the first stage, and a source terminal electrically connected to a fourth circuit node that is configured to provide current when the second p-type field effect transistor is conducting; and
a resistor resistively coupling the output terminal of the first stage and a fifth circuit node that is configured to provide current through the resistor.

12. A switching circuit in accordance with claim 11, the second stage comprising:
a first transconductance amplifier having a negative input terminal configured to receive the first reference voltage, and a positive input terminal electrically connected to the output terminal of the first stage;
a third p-type field effect transistor having gate and drain terminals electrically connected to an output terminal of the first transconductance amplifier, and a source terminal electrically connected to a sixth circuit node that is configured to provide current through the third p-type field effect transistor when conducting;
a fourth p-type field effect transistor having a gate terminal electrically connected to the output terminal of the first transconductance amplifier, a source terminal electrically connected to the sixth circuit node, and a drain terminal selectively electrically connected to the output terminal of the second stage in response to the transition high to low control signal;
a second transconductance amplifier having a negative input terminal configured to receive the second reference voltage, and a positive input terminal electrically connected to the output terminal of the first stage;
a first n-type field effect transistor having gate and drain terminals electrically connected to an output terminal of the second transconductance amplifier, and a source terminal electrically connected to a seventh circuit node that is configured to drawn current through the first n-type field effect transistor when conducting; and
a second n-type field effect transistor having a gate terminal electrically connected to the output terminal of the second transconductance amplifier, a source terminal electrically connected to the seventh circuit node, and a drain terminal selectively electrically connected to the output terminal of the second stage in response to the transition low to high control signal.

13. A switching circuit in accordance with claim 11, the second stage comprising:
a first transconductance amplifier having a negative input terminal configured to receive the first reference voltage, and a positive input terminal electrically connected to the output terminal of the first stage;
a first PNP bi-polar transistor having base and collector terminals electrically connected to an output terminal of the first transconductance amplifier, and an emitter terminal electrically connected to a sixth circuit node that is configured to provide current through the first PNP bi-polar transistor;

a second PNP bi-polar transistor having a base terminal electrically connected to the output terminal of the first transconductance amplifier, an emitter terminal electrically connected to the sixth circuit node, and a collector terminal selectively electrically connected to the output terminal of the second stage in response to the transition high to low control signal;

a second transconductance amplifier having a negative input terminal configured to receive the second reference voltage, and a positive input terminal electrically connected to the output terminal of the first stage;

a first NPN bi-polar transistor having base and collector terminals electrically connected to an output terminal of the second transconductance amplifier, and an emitter terminal electrically connected to a seventh circuit node that is configured to drawn current through the first NPN bi-polar transistor; and a second NPN bi-polar transistor having a base terminal electrically connected to the output terminal of the second transconductance amplifier, an emitter terminal electrically connected to the seventh circuit node, and a collector terminal selectively electrically connected to the output terminal of the second stage in response to the transition low to high control signal.

14. A switching circuit comprising:

a switch field effect transistor having a gate terminal, a source terminal electrically connected to a first circuit node that is configured to provide or draw current when the switch field effect transistor is conducting, and a drain terminal that is electrically connected to an output terminal of the switching circuit;

a current source configured to provide current to the gate terminal of the switch field effect transistor in response to a transition high to low control signal, wherein the current source is configured to provide a lesser or no current to the gate terminal of the switch field effect transistor in response to a transition low to high control signal;

a current sink configured to draw current from the gate terminal of the switch field effect transistor in response to a transition low to high control signal, wherein the current sink is configured to draw a lesser or no current from the gate terminal of the switch field effect transistor in response to a transition high to low control signal; and a control loop component configured to do the following when a resistance is present between the output terminal of the switching circuit and a second circuit node that provides current if the first circuit node draws current and that draws current if the first circuit node provides current:

an act of at least partially pre-charging the gate terminal of the switch field effect transistor through a closed control loop during at least an initial time when the switching circuit is transitioning in a first direction;

an act of at least partially pre-discharging the gate terminal of the switch field effect transistor through the closed control loop during at least an initial time when the switching circuit is transitioning in a second direction opposite the first direction; and an act of temporarily opening the closed control loop during at least a portion of a time when the switching circuit is transitioning in either the first direction or the second direction, wherein the control loop component comprises the following:

a first stage having an input terminal electrically connected to the drain terminal of the switch field effect transistor, and an output terminal, wherein the first stage is configured to change a first stage output voltage applied to the output terminal of the first stage depending on a first stage input voltage on the input terminal of the first stage, and wherein the first stage output voltage is a function of the rate of change of the input voltage such that if the rate of change increases above a certain rate, the first stage output voltage decreased to below a first reference voltage, and such that if the rate of change decreases below a certain rate, the first stage output voltage increases above a second reference voltage; and a second stage having an input terminal electrically connected to the output terminal of the first stage and an output terminal that is electrically coupled to the gate terminal of the switch field effect transistor, wherein the second stage is configured to perform the following:

if the first stage output voltage applied to the input terminal of the second stage is below the second reference voltage, a current is provided through the output terminal of the second stage to the gate terminal of the switch field effect transistor;

if the first stage output voltage applied to the input terminal of the second stage is above the first reference voltage, a current is drawn from the gate terminal of the switch field effect transistor through the output terminal of the second stage; and if the first stage output voltage is below the first reference voltage and the switching circuit is transitioning from low to high, or if the first stage output voltage is above the second reference voltage and the switching circuit is transitioning from high to low, the output terminal of the first stage is substantially electrically disconnected from the gate terminal of the switch field effect transistor, the first stage comprising:

a capacitor capacitively coupling the drain terminal of the switch field effect transistor to a second terminal of the capacitor;

a first NPN bi-polar transistor having base and collector terminals electrically connected to the second terminal of the capacitor, and an emitter terminal electrically connected to a third circuit node that is configured to draw current;

a second current source configured to provide a substantially constant current to the second terminal of the capacitor;

a second NPN bi-polar transistor having a base terminal electrically connected to the second terminal of the capacitor, a collector terminal electrically connected to the output terminal of the first stage, and an emitter terminal electrically connected to a fourth circuit node that is configured to draw current; and a resistor resistively coupling the output terminal of the first stage and a fifth circuit node that is configured to provide current through the resistor.

15. A switching circuit in accordance with claim 14, the second stage comprising:

a first transconductance amplifier having a negative input terminal configured to receive the first reference voltage, and a positive input terminal electrically connected to the output terminal of the first stage;

a first p-type field effect transistor having gate and drain terminals electrically connected to an output terminal of the first transconductance amplifier, and a source terminal electrically connected to a sixth circuit node that is configured to provide current through the first p-type field effect transistor when conducting;

a second p-type field effect transistor having a gate terminal electrically connected to the output terminal of the first transconductance amplifier, a source terminal electrically connected to the sixth circuit node, and a drain terminal selectively electrically connected to the output terminal of the second stage in response to the transition high to low control signal;

a second transconductance amplifier having a negative input terminal configured to receive the second reference voltage, and a positive input terminal electrically connected to the output terminal of the first stage;

a first n-type field effect transistor having gate and drain terminals electrically connected to an output terminal of the second transconductance amplifier, and a source terminal electrically connected to a seventh circuit node that is configured to drawn current through the first n-type field effect transistor when conducting; and a second n-type field effect transistor having a gate terminal electrically connected to the output terminal of the second transconductance amplifier, a source terminal electrically connected to the seventh circuit node, and a drain terminal selectively electrically connected to the output terminal of the second stage in response to the transition low to high control signal.

16. A switching circuit in accordance with claim 14, the second stage comprising:

a first transconductance amplifier having a negative input terminal configured to receive the first reference voltage, and a positive input terminal electrically connected to the output terminal of the first stage;

a first PNP bi-polar transistor having base and collector terminals electrically connected to an output terminal of the first transconductance amplifier, and an emitter terminal electrically connected to a sixth circuit node that is configured to provide current through the first PNP bi-polar transistor;

a second PNP bi-polar transistor having a base terminal electrically connected to the output terminal of the first transconductance amplifier, an emitter terminal electrically connected to the sixth circuit node, and a collector terminal selectively electrically connected to the output terminal of the second stage in response to the transition high to low control signal;

a second transconductance amplifier having a negative input terminal configured to receive the second reference voltage, and a positive input terminal electrically connected to the output terminal of the first stage;

a third NPN bi-polar transistor having base and collector terminals electrically connected to an output terminal of the second transconductance amplifier, and an emitter terminal electrically connected to a seventh circuit node that is configured to drawn current through the third NPN bi-polar transistor; and a fourth NPN bi-polar transistor having a base terminal electrically connected to the output terminal of the second transconductance amplifier, an emitter terminal electrically connected to the seventh circuit node, and a collector terminal selectively electrically connected to the output terminal of the second stage in response to the transition low to high control signal.

17. A switching circuit comprising:

a switch field effect transistor having a gate terminal, a source terminal electrically connected to a first circuit node that is configured to provide or draw current when the switch field effect transistor is conducting, and a drain terminal that is electrically connected to an output terminal of the switching circuit;

a current source configured to provide current to the gate terminal of the switch field effect transistor in response to a transition high to low control signal, wherein the current source is configured to provide a lesser or no current to the gate terminal of the switch field effect transistor in response to a transition low to high control signal;

a current sink configured to draw current from the gate terminal of the switch field effect transistor in response to a transition low to high control signal, wherein the current sink is configured to draw a lesser or no current from the gate terminal of the switch field effect transistor in response to a transition high to low control signal; and a control loop component configured to do the following when a resistance is present between the output terminal of the switching circuit and a second circuit node that provides current if the first circuit node draws current and that draws current if the first circuit node provides current:

an act of at least partially pre-charging the gate terminal of the switch field effect transistor through a closed control loop during at least an initial time when the switching circuit is transitioning in a first direction;

an act of at least partially pre-discharging the gate terminal of the switch field effect transistor through the closed control loop during at least an initial time when the switching circuit is transitioning in a second direction opposite the first direction; and an act of temporarily opening the closed control loop during at least a portion of a time when the switching circuit is transitioning in either the first direction or the second direction, wherein the control loop component comprises the following:

a first stage having an input terminal electrically connected to the drain terminal of the switch field effect transistor, and an output terminal,
  wherein the first stage is configured to change a first stage output voltage applied to the output terminal of the first stage depending on a first stage input voltage on the input terminal of the first stage, and
  wherein the first stage output voltage is a function of the rate of change of the input voltage such that if the rate of change increases above a certain rate, the first stage output voltage decreased to below a first reference voltage, and such that if the rate of change decreases below a certain rate, the first stage output voltage increases above a second reference voltage; and a second stage having an input terminal electrically connected to the output terminal of the first stage and an output terminal that is electrically coupled to the gate terminal of the switch field effect transistor, wherein the second stage is configured to perform the following:
  if the first stage output voltage applied to the input terminal of the second stage is below the second reference voltage, a current is provided through the output terminal of the second stage to the gate terminal of the switch field effect transistor;
  if the first stage output voltage applied to the input terminal of the second stage is above the first reference voltage, a current is drawn from the gate terminal of the switch field effect transistor through the output terminal of the second stage; and if the first stage output voltage is below the first reference voltage and the switching circuit is transitioning from low to high, or if the first stage output voltage is above the second reference voltage and the switching circuit is transitioning from high to low, the output terminal of the first stage is substantially electrically disconnected from the gate terminal of the switch field effect transistor, the first stage comprising:

a capacitor capacitively coupling the drain terminal of the switch field effect transistor to a second terminal of the capacitor;

a first PNP bi-polar transistor having base and collector terminals electrically connected to the second terminal of the capacitor, and an emitter terminal electrically connected to a third circuit node that is configured to provide current;

a second current sink configured to draw a substantially constant current from the second terminal of the capacitor;

a second PNP bi-polar transistor having a base terminal electrically connected to the second terminal of the capacitor, a collector terminal electrically connected to the output terminal of the first stage, and an emitter terminal electrically connected to a fourth circuit node that is configured to provide current; and a resistor resistively coupling the output terminal of the first stage and a fifth circuit node that is configured to provide current through the resistor.

18. A switching circuit in accordance with claim 17, the second stage comprising:

a first transconductance amplifier having a negative input terminal configured to receive the first reference voltage, and a positive input terminal electrically connected to the output terminal of the first stage;

a first p-type field effect transistor having gate and drain terminals electrically connected to an output terminal of the first transconductance amplifier, and a source terminal electrically connected to a sixth circuit node that is configured to provide current through the first p-type field effect transistor when conducting;

a second p-type field effect transistor having a gate terminal electrically connected to the output terminal of the first transconductance amplifier, a source terminal electrically connected to the sixth circuit node, and a drain terminal selectively electrically connected to the output terminal of the second stage in response to the transition high to low control signal;

a second transconductance amplifier having a negative input terminal configured to receive the second reference voltage, and a positive input terminal electrically connected to the output terminal of the first stage;

a first n-type field effect transistor having gate and drain terminals electrically connected to an output terminal of the second transconductance amplifier, and a source terminal electrically connected to a seventh circuit node that is configured to drawn current through the first n-type field effect transistor when conducting; and a second n-type field effect transistor having a gate terminal electrically connected to the output terminal of the second transconductance amplifier, a source terminal electrically connected to the seventh circuit node, and a drain terminal selectively electrically connected to the output terminal of the second stage in response to the transition low to high control signal.

19. A switching circuit in accordance with claim 17, the second stage comprising:

a first transconductance amplifier having a negative input terminal configured to receive the first reference voltage, and a positive input terminal electrically connected to the output terminal of the first stage;

a third PNP bi-polar transistor having base and collector terminals electrically connected to an output terminal of the first transconductance amplifier, and an emitter terminal electrically connected to a sixth circuit node that is configured to provide current through the third PNP bi-polar transistor;

a fourth PNP bi-polar transistor having a base terminal electrically connected to the output terminal of the first transconductance amplifier, an emitter terminal electrically connected to the sixth circuit node, and a collector terminal selectively electrically connected to the output terminal of the second stage in response to the transition high to low control signal;

a second transconductance amplifier having a negative input terminal configured to receive the second reference voltage, and a positive input terminal electrically connected to the output terminal of the first stage;

a first NPN bi-polar transistor having base and collector terminals electrically connected to an output terminal of the second transconductance amplifier, and an emitter terminal electrically connected to a seventh circuit node that is configured to drawn current through the first NPN bi-polar transistor; and a second NPN bi-polar transistor having a base terminal electrically connected to the output terminal of the second transconductance amplifier, an emitter terminal electrically connected to the seventh circuit node, and a collector terminal selectively electrically connected to the output terminal of the second stage in response to the transition low to high control signal.

20. A switching circuit comprising:

a switch field effect transistor having a gate terminal, a source terminal electrically connected to a first circuit node that is configured to provide or draw current when the switch field effect transistor is conducting, and a drain terminal that is electrically connected to an output terminal of the switching circuit;

a current source configured to provide current to the gate terminal of the switch field effect transistor in response to a transition high to low control signal, wherein the current source is configured to provide a lesser or no current to the gate terminal of the switch field effect transistor in response to a transition low to high control signal;

a current sink configured to draw current from the gate terminal of the switch field effect transistor in response to a transition low to high control signal, wherein the current sink is configured to draw a lesser or no current from the gate terminal of the switch field effect transistor in response to a transition high to low control signal; and a control loop component configured to do the following when a resistance is present between the output terminal of the switching circuit and a second circuit node that provides current if the first circuit node draws current and that draws current if the first circuit node provides current:

an act of at least partially pre-charging the gate terminal of the switch field effect transistor through a closed control loop during at least an initial time when the switching circuit is transitioning in a first direction;

an act of at least partially pre-discharging the gate terminal of the switch field effect transistor through the closed control loop during at least an initial time when the switching circuit is transitioning in a second direction opposite the first direction; and an act of temporarily opening the closed control loop during at least a portion of a time when the switching circuit is transitioning in either the first direction or the second direction, wherein the control loop component comprises the following:

a first stage having an input terminal electrically connected to the drain terminal of the switch field effect transistor, and an output terminal, wherein the first stage is configured to change a first stage output voltage applied to the output terminal of the first stage depending on a first stage input voltage on the input terminal of the first stage, and wherein the first stage output voltage is a function of the rate of change of the input voltage such that if the rate of change increases above a certain rate, the first stage output voltage decreased to below a first reference voltage, and such that if the rate of change decreases below a certain rate, the first stage output voltage increases above a second reference voltage; and a second stage having an input terminal electrically connected to the output terminal of the first stage and an output terminal that is electrically coupled to the gate terminal of the switch field effect transistor, wherein the second stage is configured to perform the following:

if the first stage output voltage applied to the input terminal of the second stage is below the second reference voltage, a current is provided through the output terminal of the second stage to the gate terminal of the switch field effect transistor;

if the first stage output voltage applied to the input terminal of the second stage is above the first reference voltage, a current is drawn from the gate terminal of the switch field effect transistor through the output terminal of the second stage; and if the first stage output voltage is below the first reference voltage and the switching circuit is transitioning from low to high, or if the first stage output voltage is above the second reference voltage and the switching circuit is transitioning from high to low, the output terminal of the first stage is substantially electrically disconnected from the gate terminal of the switch field effect transistor, the second stage comprising:

a first transconductance amplifier having a negative input terminal configured to receive the first reference voltage, and a positive input terminal electrically connected to the output terminal of the first stage;

a first p-type field effect transistor having gate and drain terminals electrically connected to an output terminal of the first transconductance amplifier, and a source terminal electrically connected to a sixth circuit node that is configured to provide current through the first p-type field effect transistor when conducting;

a second p-type field effect transistor having a gate terminal electrically connected to the output terminal of the first transconductance amplifier, a source terminal electrically connected to the sixth circuit node, and a drain terminal selectively electrically connected to the output terminal of the second stage in response to the transition high to low control signal;

a second transconductance amplifier having a positive input terminal configured to receive the second reference voltage, and a negative input terminal electrically connected to the output terminal of the first stage;

a first n-type field effect transistor having gate and drain terminals electrically connected to an output terminal of the second transconductance amplifier, and a source terminal electrically connected to a seventh circuit node that is configured to drawn current through the first n-type field effect transistor when conducting; and a second n-type field effect transistor having a gate terminal electrically connected to the output terminal of the second transconductance amplifier, a source terminal electrically connected to the sixth circuit node, and a drain terminal selectively electrically connected to the output terminal of the second stage in response to the transition low to high control signal.

21. A switching circuit comprising:

a switch field effect transistor having a gate terminal, a source terminal electrically connected to a first circuit node that is configured to provide or draw current when the switch field effect transistor is conducting, and a drain terminal that is electrically connected to an output terminal of the switching circuit;

a current source configured to provide current to the gate terminal of the switch field effect transistor in response to a transition high to low control signal, wherein the current source is configured to provide a lesser or no current to the gate terminal of the switch field effect transistor in response to a transition low to high control signal;

a current sink configured to draw current from the gate terminal of the switch field effect transistor in response to a transition low to high control signal, wherein the current sink is configured to draw a lesser or no current from the gate terminal of the switch field effect transistor in response to a transition high to low control signal; and a control loop component configured to do the following when a resistance is present between the output terminal of the switching circuit and a second circuit node that provides current if the first circuit node draws current and that draws current if the first circuit node provides current:

an act of at least partially pre-charging the gate terminal of the switch field effect transistor through a closed control loop during at least an initial time when the switching circuit is transitioning in a first direction;

an act of at least partially pre-discharging the gate terminal of the switch field effect transistor through the closed control loop during at least an initial time when the switching circuit is transitioning in a second direction opposite the first direction; and an act of temporarily opening the closed control loop during at least a portion of a time when the switching circuit is transitioning in either the first direction or the second direction, wherein the control loop component comprises the following:

a first stage having an input terminal electrically connected to the drain terminal of the switch field effect transistor, and an output terminal, wherein the first stage is configured to change a first stage output voltage applied to the output terminal of the first stage depending on a first stage input voltage on the input terminal of the first stage, and wherein the first stage output voltage is a function of the rate of change of the input voltage such that if the rate of change increases above a certain rate, the first stage output voltage decreased to below a first reference voltage, and such that if the rate of change decreases below a certain rate, the first stage output voltage increases above a second reference voltage; and a second stage having an input terminal electrically connected to the output terminal of the first stage and an output terminal that is electrically coupled to the gate terminal of the switch field effect transistor, wherein the second stage is configured to perform the following:

if the first stage output voltage applied to the input terminal of the second stage is below the second reference voltage, a current is provided through the output terminal of the second stage to the gate terminal of the switch field effect transistor;

if the first stage output voltage applied to the input terminal of the second stage is above the first reference voltage, a current is drawn from the gate terminal of the switch field effect transistor through the output terminal of the second stage; and if the first stage output voltage is below the first reference voltage and the switching circuit is transitioning from low to high, or if the first stage output voltage is above the second reference voltage and the switching circuit is transitioning from high to low, the output terminal of the first stage is substantially electrically disconnected from the gate terminal of the switch field effect transistor, the second stage comprising:

a first transconductance amplifier having a negative input terminal configured to receive the first reference voltage, and a positive input terminal electrically connected to the output terminal of the first stage;

a first PNP bi-polar transistor having base and collector terminals electrically connected to an output terminal of the first transconductance amplifier, and an emitter terminal electrically connected to a sixth circuit node that is configured to provide current through the first PNP bi-polar transistor;

a second PNP bi-polar transistor having a base terminal electrically connected to the output terminal of the first transconductance amplifier, an emitter terminal electrically connected to the sixth circuit node, and a collector terminal selectively electrically connected to the output terminal of the second stage in response to the transition high to low control signal;

a second transconductance amplifier having a positive input terminal configured to receive the second reference voltage, and a negative input terminal electrically connected to the output terminal of the first stage;

a first NPN bi-polar transistor having base and collector terminals electrically connected to an output terminal of the second transconductance amplifier, and an emitter terminal electrically connected to a seventh circuit node that is configured to drawn current through the first NPN bi-polar transistor; and a second NPN bi-polar transistor having a base terminal electrically connected to the output terminal of the second transconductance amplifier, an emitter terminal electrically connected to the seventh circuit node, and a collector terminal selectively electrically connected to the output terminal of the second stage in response to the transition low to high control signal.

22. A switching circuit comprising:

a switch field effect transistor having a gate terminal, a source terminal electrically connected to a first circuit node that is configured to provide or draw current when the switch field effect transistor is conducting, and a drain terminal that is electrically connected to an output terminal of the switching circuit;

a current source configured to provide current to the gate terminal of the switch field effect transistor in response to a transition high to low control signal, wherein the current source is configured to provide a lesser or no current to the gate terminal of the switch field effect transistor in response to a transition low to high control signal;

a current sink configured to draw current from the gate terminal of the switch field effect transistor in response to a transition low to high control signal, wherein the current sink is configured to draw a lesser or no current from the gate terminal of the switch field effect transistor in response to a transition high to low control signal; and a control loop component configured to do the following when a resistance is present between the output terminal of the switching circuit and a second circuit node that provides current if the first circuit node draws current and that draws current if the first circuit node provides current:

an act of at least partially pre-charging the gate terminal of the switch field effect transistor through a closed control loop during at least an initial time when the switching circuit is transitioning in a first direction;

an act of at least partially pre-discharging the gate terminal of the switch field effect transistor through the closed control loop during at least an initial time when the switching circuit is transitioning in a second direction opposite the first direction; and an act of temporarily opening the closed control loop during at least a portion of a time when the switching circuit is transitioning in either the first direction or the second direction, wherein the control loop component comprises:

a capacitor capacitively coupling the drain terminal of the switch field effect transistor to a second terminal of the capacitor;

a first n-type field effect transistor having gate and drain terminals electrically connected to the second terminal of the capacitor, and a source terminal electrically connected to a third circuit node that is configured to draw current when the first n-type field effect transistor is conducting;

a second current source configured to provide a substantially constant current to the second terminal of the capacitor;

a second n-type field effect transistor having a gate terminal electrically connected to the second terminal of the capacitor, a drain terminal, and a source terminal that is coupled to a fourth circuit node that is configured to draw current when the second n-type field effect transistor is conducting;

a third current source configured to provide a substantially constant current, wherein the drain terminal of the second n-type field effect transistor is coupled to the third current source;

a third n-type field effect transistor having a gate terminal electrically connected to the second terminal of the capacitor, a drain terminal, and a source terminal that is coupled to a fifth circuit node that is configured to draw current when the second n-type field effect transistor is conducting;

a fourth current source configured to provide a substantially constant current, wherein the drain terminal of the third n-type field effect transistor is coupled to the third current source;

a first p-type field effect transistor having gate and drain terminals electrically connected to the drain terminal of the second n-type field effect transistor, and having a source terminal coupled to a sixth circuit node that is configured to provide current when the first p-type field effect transistor is conducting;

a second p-type field effect transistor having gate and drain terminals electrically connected to the drain terminal of the second n-type field effect transistor, and having a source terminal coupled to a seventh circuit node that is configured to provide current when the second p-type field effect transistor is conducting;

a fourth n-type field effect transistor having gate and drain terminals electrically connected to the drain terminal of the third n-type field effect transistor, and having a source terminal coupled to an eighth circuit node that is configured to draw current when the fourth n-type field effect transistor is conducting;

a fifth n-type field effect transistor having gate and drain terminals electrically connected to the drain terminal of the third n-type field effect transistor, and having a source terminal coupled to a ninth circuit node that is configured to draw current when the fifth n-type field effect transistor is conducting;

a first switch selectively electrically connecting the drain terminal of the second p-type transistor to the output terminal; and a second switch selectively electrically connecting the drain terminal of the fifth n-type field effect transistor to the output terminal.

23. A method for switching a switching circuit that includes a switch field effect transistor having a gate terminal, a source terminal electrically connected to a first circuit node that is configured to provide or draw current when the switch field effect transistor is conducting, and a drain terminal that is electrically connected to an output terminal of the switching circuit, the method comprising:

an act of detecting a transition high to low signal;

in response to the act of detecting the transition high to low signal, an act of causing a current source to provide current to the gate terminal of the switch field effect transistor; and also in response to the act of detecting the transition high to low signal, an act of causing a control loop component to an act of at least partially pre-charge the gate terminal of the switch field effect transistor through a closed control loop during an initial portion of a time when the switching circuit is transitioning from high to low, and then an act of temporarily opening the closed control loop for at least a portion of the remaining time when the switching circuit is transitioning from high to low.

24. A method in accordance with claim 23, further comprising:

an act of detecting a transition low to high signal;

in response to the act of detecting the transition low to high signal, an act of causing a current sink to draw current from the gate terminal of the switch field effect transistor; and also in response to the act of detecting the transition low to high signal, an act of causing the control loop component to at least partially pre-discharge the gate terminal of the switch field effect transistor through the closed control loop during an initial portion of a time when the switching circuit is transitioning from low to high, and then an act of temporarily opening the closed control loop for at least a portion of the remaining time when the switching circuit is transitioning from low to high.

25. A method for switching a switching circuit that includes a switch field effect transistor having a gate terminal, a source terminal electrically connected to a first circuit node that is configured to provide or draw current when the switch field effect transistor is conducting, and a drain terminal that is electrically connected to an output terminal of the switching circuit, the method comprising:

an act of detecting a transition low to high signal;

in response to the act of detecting the transition low to high signal, an act of causing a current sink to draw current from the gate terminal of the switch field effect transistor; and also in response to the act of detecting the transition low to high signal, an act of causing a control loop component to at least partially pre-discharge the gate terminal of the switch field effect transistor through the closed control loop during an initial portion of a time when the switching circuit is transitioning from low to high, and then an act of temporarily opening the closed control loop for at least a portion of the remaining time when the switching circuit is transitioning from high to low.

26. A method in accordance with claim 25, wherein the switch field effect transistor is an n-type field effect transistor, and the first circuit node is configured to draw current when the n-type field effect transistor is conducting.

27. A method in accordance with claim 25, wherein the switch field effect transistor is a p-type field effect transistor, and the first circuit node is configured to provide current when the p-type field effect transistor is conducting.

* * * * *

UNITED STATES PATENT AND TRADEMARK OFFICE
CERTIFICATE OF CORRECTION

PATENT NO. : 7,724,066 B2
APPLICATION NO. : 11/157402
DATED : May 25, 2010
INVENTOR(S) : Kamenický et al.

Page 1 of 1

It is certified that error appears in the above-identified patent and that said Letters Patent is hereby corrected as shown below:

Face
Item 57, ABSTRACT, Line 6, change "change at specified speed" to --change at a specified speed--

Column 4
Line 37, change "VOUT" to --$V_{OUT}$--
Line 63, change "Vout" to --$V_{OUT}$--

Column 5
Line 8, change "Vout" to --$V_{OUT}$--
Line 24, change "control loop component 132" to --control loop component 132A--
Line 41, change "control loop component 132" to --control loop component 132A--

Column 6
Line 57, change "FIGS. 3A" to --FIG. 3A--

Column 7
Line 38, after "S1" insert --.--

Column 8
Line 37, change "13" to --I3--

Column 10
Line 10, change "that be apparent" to --that are apparent--

Column 11
Line 41, change "drawn" to --draw--

Column 12
Line 24, change "increase" to --increases--

Signed and Sealed this
Eighteenth Day of January, 2011

David J. Kappos
*Director of the United States Patent and Trademark Office*